United States Patent
Wu et al.

(10) Patent No.: US 10,819,289 B1
(45) Date of Patent: Oct. 27, 2020

(54) SIGNAL PROCESSING CIRCUIT

(71) Applicant: Realtek Semiconductor Corp., HsinChu (TW)

(72) Inventors: Chao-Huang Wu, Taoyuan (TW); Ka-Un Chan, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/874,654

(22) Filed: May 14, 2020

(30) Foreign Application Priority Data

May 22, 2019 (TW) .............................. 108117670 A

(51) Int. Cl.
| | | |
|---|---|---|
| *H03H 11/52* | (2006.01) | |
| *H03F 1/08* | (2006.01) | |
| *H03G 3/30* | (2006.01) | |
| *H03F 3/45* | (2006.01) | |
| *H03G 1/00* | (2006.01) | |

(52) U.S. Cl.
CPC ......... *H03F 1/086* (2013.01); *H03F 3/45264* (2013.01); *H03G 1/0088* (2013.01); *H03G 3/3005* (2013.01); *H03H 11/52* (2013.01)

(58) Field of Classification Search
CPC ... H03F 1/086; H03F 3/45264; H03G 1/0088; H03G 3/3005
See application file for complete search history.

(56) References Cited

U.S. PATENT DOCUMENTS

| | | | | |
|---|---|---|---|---|
| 7,619,472 B1 * | 11/2009 | Tekin | .................. | H03F 3/45475 330/252 |
| 7,737,802 B2 | 6/2010 | Lee | | |
| 9,379,676 B2 * | 6/2016 | Johnson | .................... | H03F 1/56 |

* cited by examiner

*Primary Examiner* — Dinh T Le
(74) *Attorney, Agent, or Firm* — Winston Hsu

(57) ABSTRACT

A signal processing circuit includes a signal receiving circuit for generating a first input signal and a second input signal; a signal output circuit for generating a first output signal and a second output signal according to the first input signal and the second input signal; a negative impedance circuit, for amplifying the first input signal at the first input terminal to generate a first amplified input signal at the second output terminal, and for amplifying the second input signal at the second input terminal to generate a second amplified input signal at the first output terminal; a first capacitor; a second capacitor; wherein the first capacitor and the second capacitor have different DC voltage levels at both terminals, such that the impedance-signal variation rate of the negative impedance circuit is lower than a predetermined level.

20 Claims, 7 Drawing Sheets

SIGNAL PROCESSING CIRCUIT

BACKGROUND OF THE INVENTION

1. Field of the Invention

The present invention relates to a signal processing circuit, and particularly relates to a signal processing circuit can enhance a linearity of a negative impedance circuit.

2. Description of the Prior Art

A conventional receiver may have an issue that the in band signal is weak but the out of band noise is strong. In such case, the receiver must amplify the in band signal and avoid the interference caused by the out of band noise. That is, the receiver needs a better linearity.

Some receivers may have a negative impedance circuit to increase a gain for signals. However, a conventional negative impedance circuit has a poor linearity, thus the out of band noise seriously affect a performance of the receiver.

SUMMARY OF THE INVENTION

One objective of the present invention is to provide a signal processing circuit comprising a negative impedance circuit with a better linearity.

Another objective of the present invention is to provide a receiver comprising a negative impedance circuit with a better linearity.

One embodiment of the present invention discloses a signal processing circuit comprising: a signal receiving circuit, coupled to a first predetermined voltage level, configured to generate a first input signal and a second input signal; a signal output circuit, configured to respectively generate a first output signal and a second output signal according to the first input signal and the second input signal; a negative impedance circuit, comprising a first input terminal, a second input terminal, a first output terminal and a second output terminal, wherein the first output terminal and the second output terminal are coupled to the signal receiving circuit, and the first input terminal, the second input terminal are coupled to the signal output circuit, wherein the negative impedance circuit receives the first input signal at the first input terminal and amplifies the first input signal to generate a first amplified input signal at the second output terminal, wherein the negative impedance circuit receives the second input signal at the second input terminal and amplifies the second input signal to generate a second amplified input signal at the first output terminal; a first capacitor, comprising a first terminal coupled to the first output terminal and comprising a second terminal coupled to the first input terminal; a second capacitor, comprising a first terminal coupled to the second output terminal and comprising a second terminal coupled to the second input terminal. A first DC voltage level at the first terminal of the first capacitor is different from a second DC voltage level at the second terminal of the first capacitor, and a third DC voltage level at the first terminal of the second capacitor is different from a fourth DC voltage level at the second terminal of the second capacitor, thereby an impedance-signal variation rate is lower than a predetermined level.

Another embodiment of the present invention discloses a receiver, comprising: a signal receiving circuit, coupled to a first predetermined voltage level, configured to generate a first input signal and a second input signal; a signal output circuit, configured to respectively generate a first output signal and a second output signal according to the first input signal and the second input signal; a negative impedance circuit, comprising a first input terminal, a second input terminal, a first output terminal and a second output terminal, wherein the first output terminal and the second output terminal are coupled to the signal receiving circuit, and the first input terminal, the second input terminal are coupled to the signal output circuit, wherein the negative impedance circuit receives the first input signal at the first input terminal and amplifies the first input signal to generate a first amplified input signal at the second output terminal, wherein the negative impedance circuit receives the second input signal at the second input terminal and amplifies the second input signal to generate a second amplified input signal at the first output terminal; a first capacitor, comprising a first terminal coupled to the first output terminal and comprising a second terminal coupled to the first input terminal; a second capacitor, comprising a first terminal coupled to the second output terminal and comprising a second terminal coupled to the second input terminal. A first DC voltage level at the first terminal of the first capacitor is different from a second DC voltage level at the second terminal of the first capacitor, and a third DC voltage level at the first terminal of the second capacitor is different from a fourth DC voltage level at the second terminal of the second capacitor, thereby an impedance-signal variation rate is lower than a predetermined level.

In view of above-mentioned embodiments, the negative impedance circuit provides signal gains and has a good linearity to improve the issue of the conventional negative impedance circuit.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, several embodiments are provided to explain the concept of the present invention. Please note, in following embodiments, terms "first", "second" . . . and the like are applied for identifying different components or steps, but do not mean to limit the sequences thereof. Additionally, a Quadrature Receiver is taken as an example for explaining in following embodiments, however, the concept disclosed by the present invention can be applied to other kinds of signal processing circuits.

Figure 1:
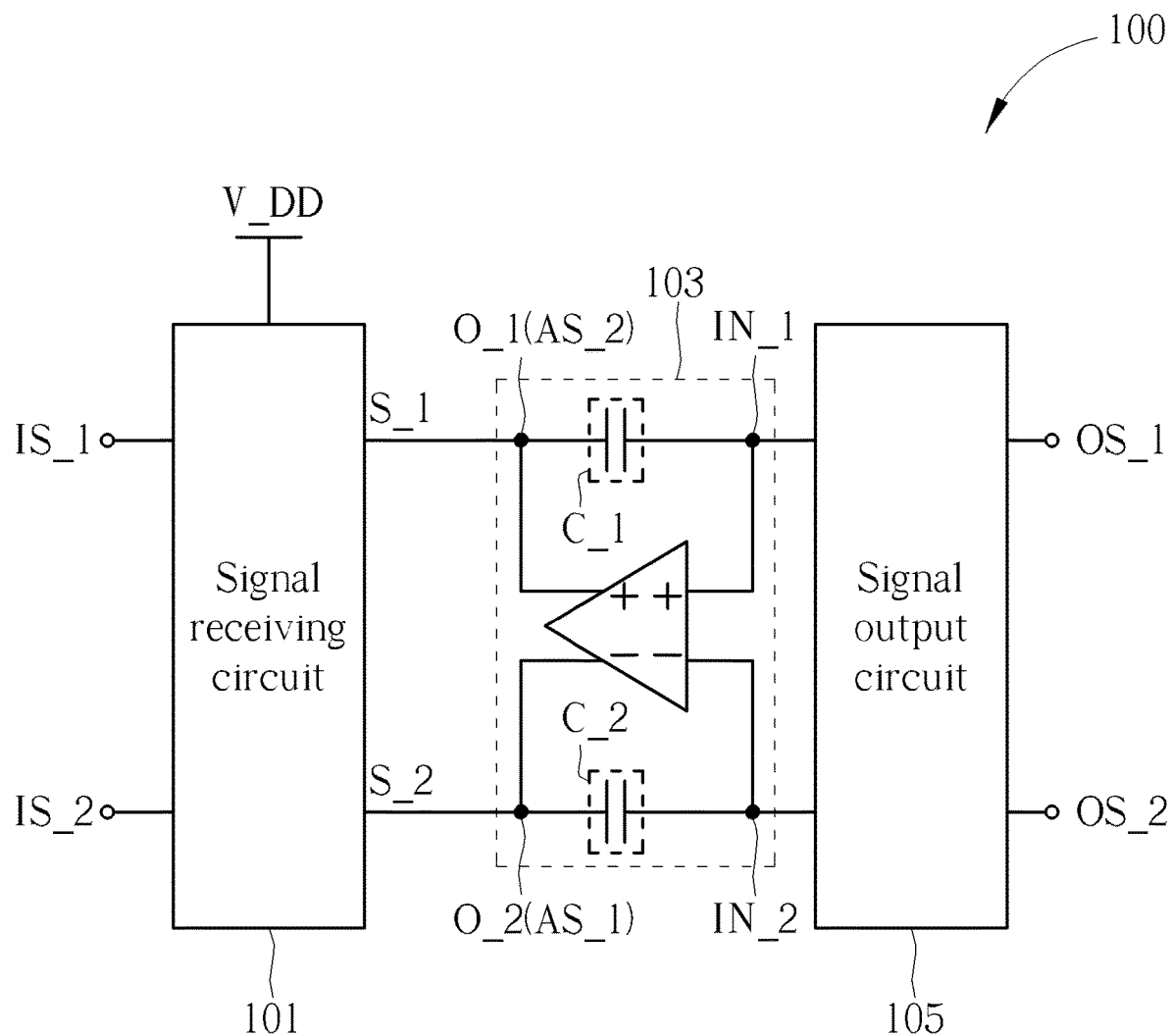
FIG. 1 is a block diagram illustrating a receiver according to one embodiment of the present invention.

FIG. 1 is a block diagram illustrating a receiver according to one embodiment of the present invention. As shown in FIG. 1, the signal processing circuit 100 comprises a signal receiving circuit 101, a negative impedance circuit 103, and a signal output circuit 105. The negative impedance circuit 103 comprises a first capacitor C_1 and a second capacitor C_2. The signal receiving circuit 101 is coupled to a first predetermined voltage level (V_DD in this example), and receives the first initial input signal IS_1 and the second initial input signal IS_2 for generating the first input signal S_1 and the second input signal S_2. The first input signal S_1 and the second input signal S_2 can form a differential input signal. The negative impedance circuit 103 comprises a first input terminal IN_1, a first output terminal O_1 (in this example, a positive input terminal and a positive output terminal), and a second input terminal IN_2 and a second output terminal O_2 (in this example, a negative input terminal and a negative output terminal). The first output terminal O_1 and the second output terminal O_2 are coupled to the signal receiving circuit 101, and the first input terminal IN_1 and the second input terminal IN_2 are coupled to the signal output circuit 105.

The negative impedance circuit 103 receives the first input signal S_1 at the first input terminal IN_1 and amplifies the first input signal S_1 to generate a first amplified input signal AS_1 at the second output terminal O_2, and receives the second input signal S_2 at the second input terminal IN_2 and amplifies the second input signal S_2 to generate a second amplified input signal AS_2 at the first output terminal O_1. The first amplified input signal AS_1 and the second amplified input signal AS_2 are received by the signal output circuit 105. The first capacitor C_1 comprises a first terminal and a second terminal. The first terminal is coupled to the first output terminal O_1 of the negative impedance circuit 103 and the second terminal is coupled to the first input terminal IN_1 of the negative impedance circuit 103. The second capacitor C_2 also comprises a first terminal and a second terminal. The first terminal is coupled to the second output terminal O_2 of the negative impedance circuit 103 and the second terminal is coupled to the second input terminal IN_2 of the negative impedance circuit 103. The signal output circuit 105 is configured to generate the first output signal OS_1 and the second output signal OS_2 according to the first amplified input signal AS_1 and the second amplified input signal AS_2. The first output signal OS_1 and the second output signal OS_2 form a differential output signal.

Since the signal at the first output terminal O_1 of the negative impedance circuit 103 is an amplified signal of the signal received by the first input terminal IN_1, the voltages at the first output terminal O_1 and the second output terminal O_2 of the negative impedance circuit 103 are respectively higher than voltages at the first input terminal IN_1 and the second input terminal IN_2. Accordingly, the negative impedance circuit 103 can provide a negative impedance to the signal output from the signal receiving circuit 101. In addition, the capacitor has the characteristics of separating the DC voltage levels on both sides, that is, the DC voltage levels at both terminals of the capacitor are different. In detail, the first DC voltage level at the first terminal of the first capacitor C_1 is different from the second DC voltage level at the second terminal of the first capacitor C_1, and the third DC voltage level at the first terminal of the second capacitor C_2 is different from the fourth DC voltage level at the second terminal of the second capacitor C_2. In this example, the first DC voltage level at the first terminal of the first capacitor C_1 is higher than the second DC voltage level at the second terminal of the first capacitor C_1, and the third terminal at the first terminal of the second capacitor C_2 is higher than a fourth DC voltage level at the second terminal of the second capacitor C_2, thereby the impedance-signal variation rate of the negative impedance circuit 103 can be lower than a predetermined level. That is, the first capacitor C_1 and the second capacitor C_2 of the negative impedance circuit 103 are respectively located between the input terminal and the output terminal of the negative impedance circuit 103, Also, the first DC voltage level at the first terminal of the first capacitor C_1 is higher than the second DC voltage level at the second terminal of the first capacitor C_1. Additionally, the third DC voltage level at the first terminal of the second capacitor C_2 is higher than the fourth DC voltage level at the second terminal of the second capacitor C_2. Based on these mechanisms, the negative impedance circuit 103 can operate in a mode with a higher linearity, and the impedance-signal variation rate of the negative impedance circuit 103 is lower than a predetermined level. Therefore, the impedance of the negative impedance circuit 103 does not change dramatically due to the variation of the signal, thus the decreasing of its linearity can be avoided.

Figure 2:
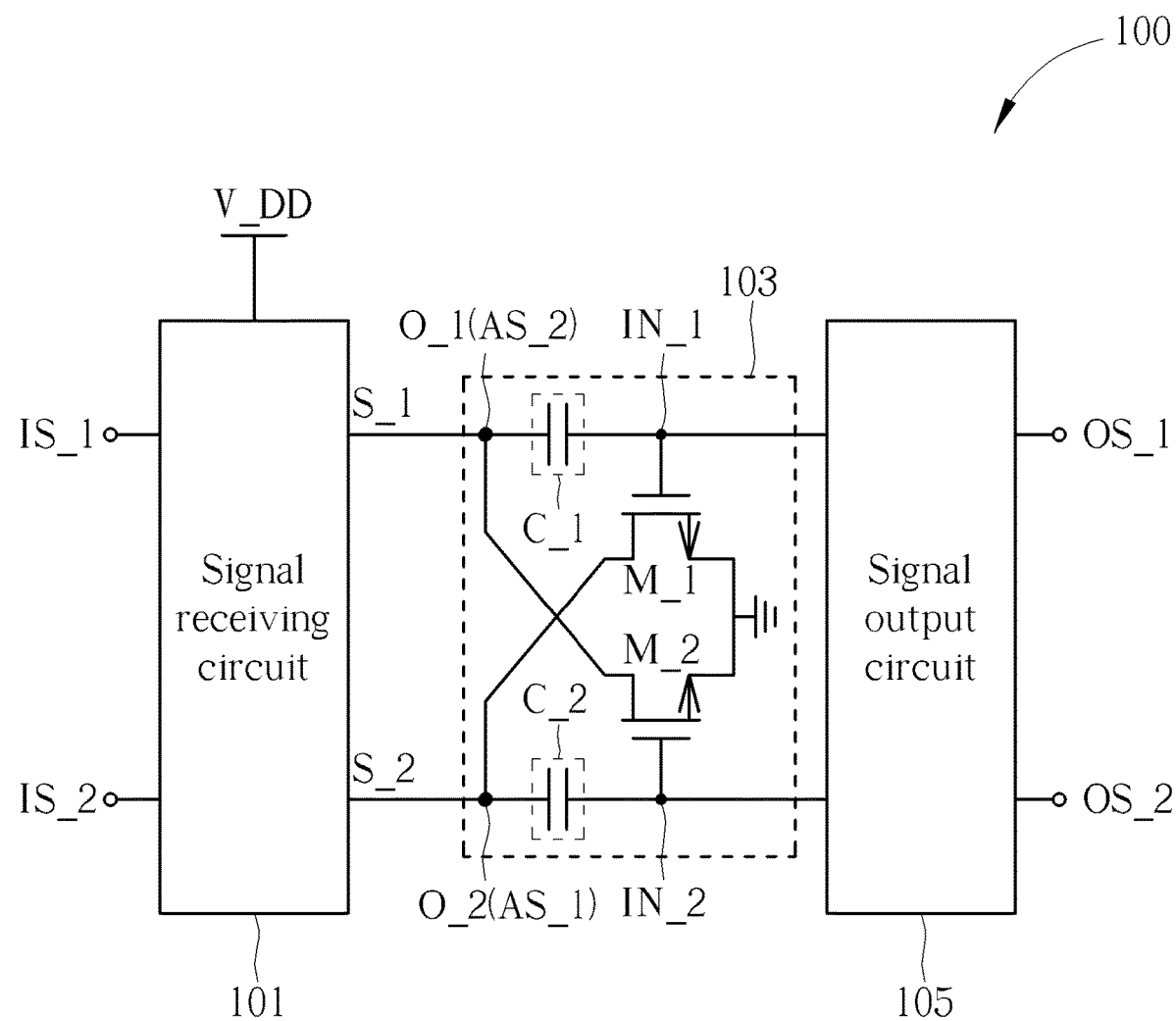
FIG. 2 is a more detail circuit diagram of the negative impedance circuit according to one embodiment of the present invention.

FIG. 2 is a more detail circuit diagram of the negative impedance circuit according to one embodiment of the present invention. As shown in FIG. 2, the negative impedance circuit 103 comprises a first transistor M_1 and a second transistor M_2. The transistor M_1 comprises a control terminal (serving as the first input terminal IN_1) coupled to the second terminal of the first capacitor C_1, a first terminal (serving as the second output terminal O_2) coupled to the first terminal of the second capacitor C_2, and a second terminal coupled to a second predetermined voltage level (ground voltage level in this example). The transistor M_2 comprises a control terminal (serving as the second input terminal IN_2) coupled to the second terminal of the second capacitor C_2, a first terminal (serving as the first output terminal O_1) coupled to the first terminal of the first capacitor C_1, and a second terminal coupled to the second predetermined voltage level. In one embodiment, the first transistor M_1 is a first NMOSFET (N-channel Metal-Oxide-Semiconductor Field-Effect Transistor). A gate of the first NMOS is a control terminal of the first transistor M_1, a drain of the first NMOS is a first terminal of the first transistor M_1, and a source of the first NMOS is the second terminal of the first transistor M_1. The second transistor M_2 is a second NMOS. A gate of the second NMOS is the control terminal of the second transistor M_2, a drain of the second NMOS is the first terminal of the second transistor M_2, and a source of the second NMOS is the second terminal of the second transistor M_2. In another embodiment, the first transistor M_1 is a first PMOSFET (P-channel Metal-Oxide-Semiconductor Field-Effect Transistor). In such case, a gate of the first PMOS is the control terminal of the first transistor M_1, a drain of the first PMOS is the first terminal of the first transistor M_1 and a source of the first PMOS is a second terminal of the first transistor M_1. Also, in such case, the first predetermined voltage level which the signal receiving circuit 101 is coupled to is the ground voltage level rather than V_DD, and the second predetermined voltage level is V_DD rather than the ground voltage level. Further, in such case, the second transistor M_2 is also a PMOSFET.

Figure 3A:
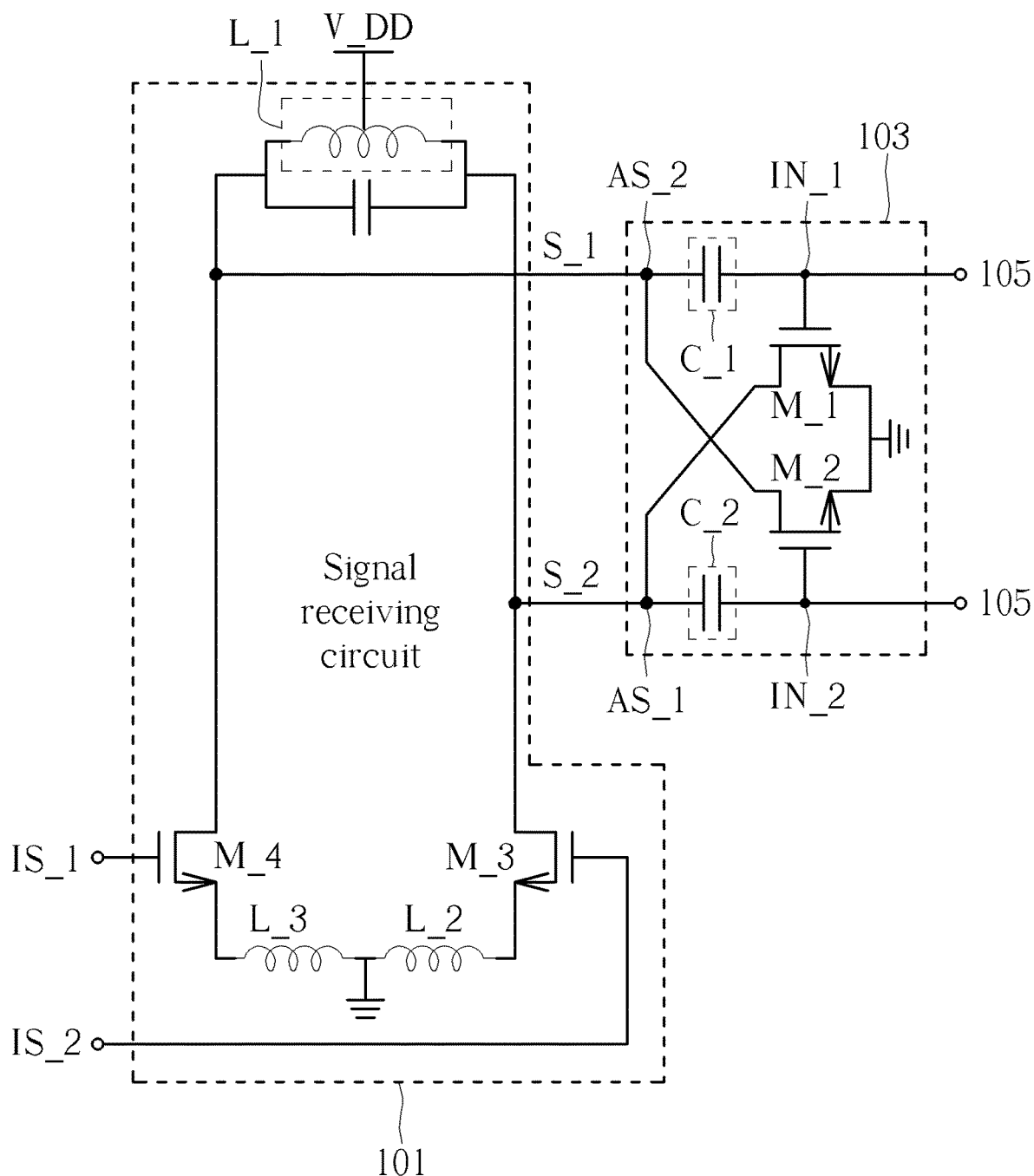
FIG. 3A and FIG. 3B are more detail circuit diagrams of receivers according to embodiments of the present invention.
Figure 3B:
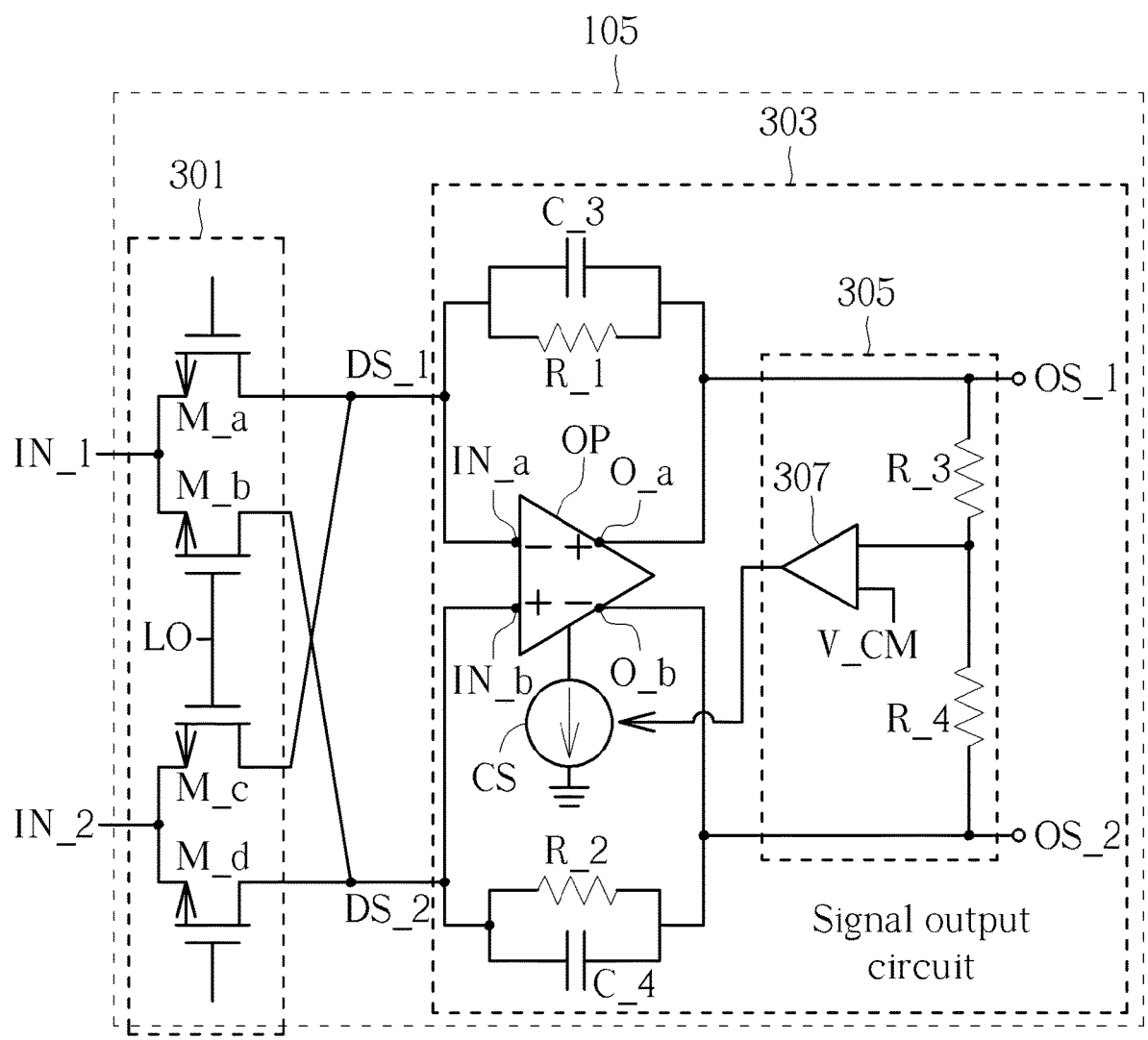

FIG. 3A and FIG. 3B are more detail circuit diagrams of receivers according to embodiments of the present invention. It should be noted, however, these circuits are for examples only, and other circuits that can achieve the same function also fall in the scope of the present invention. Please also note that some of the components in FIGS. 1 and 2 are not shown for the convenience of explaining. As shown in FIG. 3A, the signal receiving circuit 101 comprises a first inductor L_1, a second inductor L_2, a third inductor L_3, a third transistor M_3, and a fourth transistor M_4. The third transistor M_3 and the fourth transistor M_4 are both NMOSFETs in this example. The first inductor L_1, the second inductor L_2, and the third transistor M_3 generate a second input signal S_2 to the negative impedance circuit 103 according to a second initial input signal IS_2. Also, the first inductor L_1, the third inductor L_3, and the fourth transistor M_4 generate the first input signal S_1 to the negative impedance circuit 103 according to a first initial input signal IS_1.

When the third transistor M_3 and the fourth transistor M_4 are NMOSFETs, the first DC voltage level at the first terminal of the first capacitor C_1 is higher than the second DC voltage level at the second terminal of the first capacitor C_1. The third DC voltage level at the first terminal of the second capacitor C_2 is higher than the fourth DC voltage level at the second terminal of the second capacitor C_2. However, the third transistor M_3 and the fourth transistor M_4 may also be PMOSFETs. In such case, the first DC voltage level at the first terminal of the first capacitor C_1 is lower than the second DC voltage level at the second terminal of the first capacitor C_1, and the third DC voltage level on the first terminal of the second capacitor C_2 is lower than the fourth DC voltage level on the second terminal of the second capacitor C_2. However, please note that NMOSFETs and PMOSFETs can also be replaced by other transistors with similar functions. In this case, the NMOSFET can be regarded as the first type of transistor, and the PMOSFET can be regarded as the second type of transistor different from the NMOSFET.

As shown in FIG. 3B, the signal output circuit 105 comprises a mixer circuit 301 and a current-voltage converter 303. The mixer circuit 301 is configured to respectively down-convert frequencies of the first amplified input signal AS_1 and the second amplified input signal AS_2 to generate a first down-converted signal DS_1 and a second down-converted signal DS_2. In one embodiment, the mixer circuit 301 comprises transistors M_a, M_b, M_c, and M_d (in this example, NMOSFETs), and down-converts frequencies of the first amplified input signal AS_1 and the second amplified input signal AS_2 by a frequency LO. The mixer circuit 301 is not limited to the structure shown in FIG. 3B. The current-to-voltage converter 303 is coupled to the mixer circuit 301 to generate the first output signal OS_1 and the second output signal OS_2 according to the first down-converted signal DS_1 and the second down-converted signal DS_2, respectively. The current-to-voltage converter 303 comprises an operational amplifier OP comprising a first input terminal IN_a, a second input terminal IN_b, a first output terminal O_a, and a second output terminal O_b. The first input terminal IN_a and the second input terminal IN_b are coupled to the mixer circuit 301. The first output terminal O_a and the second output terminal O_b are respectively configured to output the first output signal OS_1 and the second output signal OS_2, and the operational amplifier OP generates the above-mentioned second DC voltage level at the first output terminal O_a, which is supplied to the second terminal of the first capacitor C_1. Further, the operational amplifier OP generates the fourth DC voltage level at the second output terminal O_b which is supplied to the second terminal of the second capacitor C_2.

In one embodiment, the current-to-voltage converter 303 further comprises a first current path and a second current path. The first current path comprises a first resistor R_1 and a third capacitor C_3, which are coupled between the first input terminal IN_a and the first output terminal O_a of the operational amplifier OP. The second current path comprises a second resistor R_2 and a fourth capacitor C_4 coupled between the second input terminal IN_b and the second output terminal O_b of the operational amplifier OP. Since the operational amplifier OP has a relatively large input impedance, the currents generated by the first down-converted signal DS_1 and the second down-converted signal DS_2 do not flow into the operational amplifier OP, but flows through the first current path and the second current path. Further, the first output signal OS_1 and the second output signal OS_2 are generated by the current adjusting circuit 305 comprised in the current-to-voltage converter 303.

The current adjusting circuit 305 is coupled to the first output terminal O_a and the second output terminal O_b to adjust a current of the operational amplifier OP, to adjust the above-mentioned second DC voltage level and the fourth DC voltage level. In one embodiment, the current adjusting circuit 305 comprises a comparator 307, and a third resistor R_3, a fourth resistor R_4 coupled in series. The comparator 307 comprises a first input terminal and a second input terminal. The third resistor R_3 is coupled between the first output terminal O_a of the operational amplifier OP and the first input terminal of the comparator 307. The fourth resistor R_4 is coupled between the second output terminal O_b of the operational amplifier OP and the first input terminal of the comparator 307. Additionally, the second input terminal of the comparator 307 receives a third predetermined voltage level V_CM. The comparator 307 outputs a control signal to the current source CS to control the current of the operational amplifier OP, to adjust the second DC voltage level and the fourth DC voltage level which the operational amplifier OP provides to a third predetermined voltage level V_CM. In detail, the comparator 307 compares the third predetermined voltage level V_CM and the voltage at the connection terminal of the third resistor R_3 and the fourth resistor R_4, and then controls the voltage at the connection terminal of the third resistor R_3 and the fourth resistor R_4 to be the same as the third predetermined voltage level V_CM. Thereby the second DC voltage level and the fourth DC voltage level provided at the first output terminal O_a are controlled to be the same level as the third predetermined voltage level V_CM.

In one embodiment, the third predetermined voltage level V_CM is half of the first predetermined voltage level V_DD, that is, the first DC voltage level at the first terminal of the left side of the first capacitor C_1 is the first predetermined voltage level V_DD coupled to the signal receiving circuit 101, and the second DC voltage level at the second terminal of the right side of the first capacitor C_1 is V_DD/2. Similarly, the third DC voltage level at the first terminal of the left side of the second capacitor C_2 is the first predetermined voltage level V_DD coupled to the signal receiving circuit 101, and the four DC voltage level at the second terminal of the right side of the second capacitor C_2 is V_DD/2. By the difference between the first DC voltage level and the second DC voltage level and the difference between the third DC voltage level and the fourth DC voltage level, the negative impedance circuit 103 can have a good linearity, that is, an impedance-signal variation rate of the negative impedance circuit 103 is less than a predetermined level. However, the third predetermined voltage level V_CM may also be other values, such as N times of first predetermined voltage level V_DD, and N is a non-integer between 0 and 1.

Figure 4A:
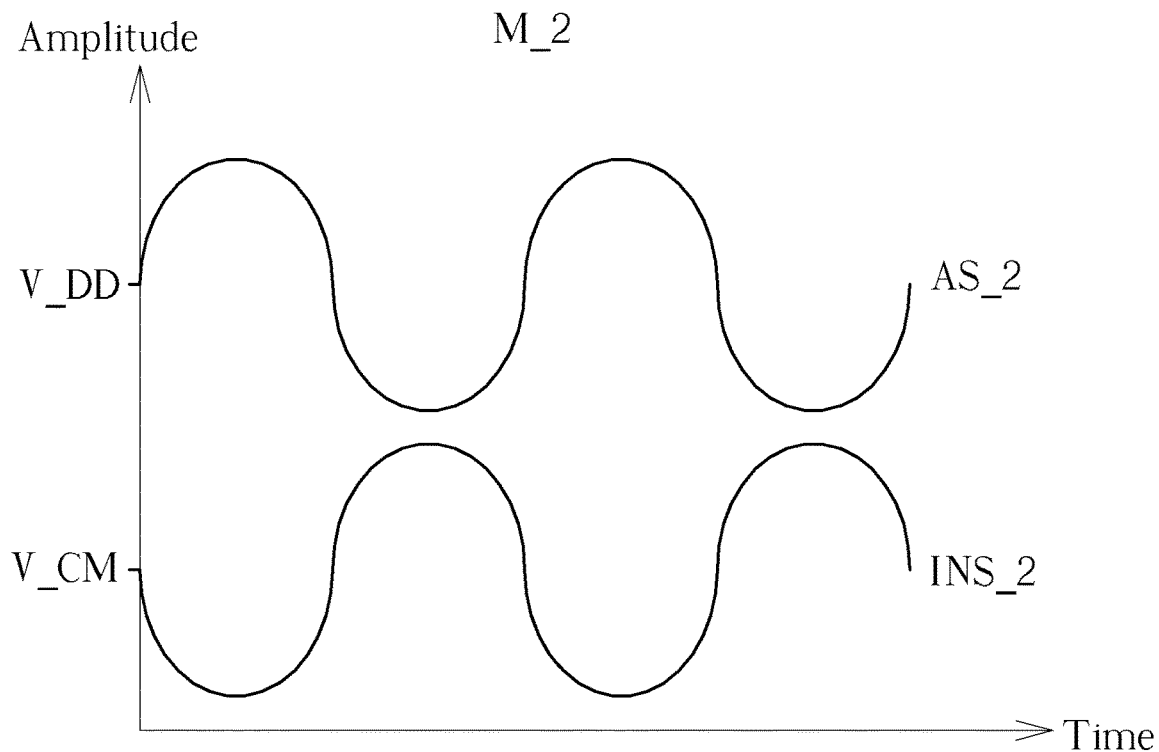
FIG. 4A and FIG. 4B are operations of receivers according to embodiments of the present invention.
Figure 4B:
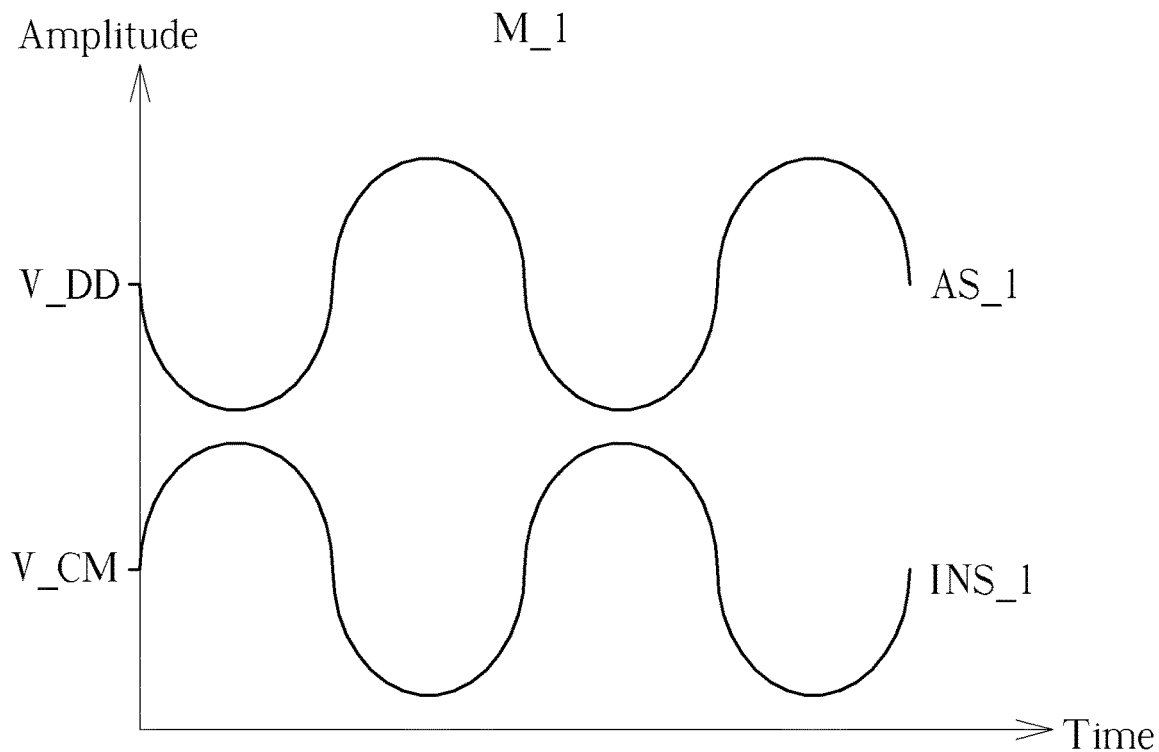

FIG. 4A and FIG. 4B are operations of receivers according to embodiments of the present invention. As shown in FIG. 4A, the DC voltage level of the second amplified input signal AS_2 at a drain of the second transistor M_2 of the negative impedance circuit 103 is the higher first predetermined voltage level V_DD. Also, the DC voltage level of the second input signal INS_2 at a gate of the second transistor the M_2 is the lower third predetermined voltage level V_CM. The second input signal INS_2 is an input signal of the second input terminal IN_2 in FIG. 1 and FIG. 2, and the second amplified input signal AS_2 is an amplified signal thereof. In one embodiment, the first predetermined voltage level V_DD is 1V and the third predetermined voltage level V_CM is 0.5V. Therefore, even when the amplitude of the second amplified input signal AS_2 is the smallest and the amplitude of the second input signal INS_2 is the largest, the gate and the drain of the second transistor M_2 have a sufficiently large voltage difference, thus the second transistor M_2 does not enter the triode region and is operated in the saturation region. The voltage relationship shown in FIG. 4A can be expressed by the following Equation (1):

$$V_{DS2} - V_{TH2} = INS\_2 - V_{TH2} < V_{DS2} = AS\_2 \quad \text{Equation (1)}$$

$V_{GS2}$ is the gate and source voltage difference of the second transistor M_2, $V_{TH2}$ is the threshold voltage of the second transistor M_2, and $V_{DS2}$ is the drain and source voltage difference of the second transistor M_2. It can be known from the Equation (1) that the DC voltage level of the second amplified input signal AS_2 is the higher first predetermined voltage level V_DD, and the DC voltage level of the second input signal INS_2 is the lower third predetermined voltage level V_CM, therefore $V_{DS2}$ will be greater than $V_{GS2} - V_{TH2}$, causing the second transistor M_2 to be operated in the saturation region.

As shown in FIG. 4B, the DC voltage level of the first amplified input signal AS_1 at the drain of the first transistor M_1 is the higher first predetermined voltage level V_DD, and the DC voltage level of the first input signal INS_1 of the gate terminal in the first transistor M_1 is the lower third predetermined voltage level V_CM. The first input signal INS_1 is an input signal of the first input terminal IN_1 in FIG. 1 and FIG. 2, and may be the first input signal S_1. Therefore, even when the amplitude of the first amplified input signal AS_1 is smallest and the amplitude of the first input terminal signal INS_1 is largest, the voltage difference between gate and the drain of the first transistor M_1 is sufficiently large. Therefore, the first transistor M_1 will not enter the triode region and will be operated in the saturation region. The voltage relationship shown in FIG. 4B can be expressed by the following Equation (2):

$$V_{GS1} - V_{TH1} = INS\_1 - V_{TH1} < V_{DS1} = AS\_1 \quad \text{Equation (2)}$$

$V_{GS1}$ is the gate and source voltage difference of the first transistor M_1, $V_{TH1}$ is the threshold voltage of the first transistor M_1, and $V_{DS1}$ is the drain and source voltage difference of the first transistor M_1. It can be known from the Equation (2) that the DC voltage level of the first amplified input signal AS_1 is the higher first predetermined voltage level V_DD, and the DC voltage level of the first input signal INS_1 is the lower third predetermined voltage level V_CM, therefore $V_{DS1}$ will be greater than $V_{GS1} - V_{TH1}$, causing the first transistor M_1 to be operated in the saturation region.

The impedance-signal variation rates of the first transistor M_1 and the second transistor M_2 are smaller when the first transistor M_1 and the second transistor M_2 are operated in the saturation region. By this way, the impedance-signal variation rate of the negative impedance circuit 103 can be smaller than a predetermined level, thus has a better linearity.

Figure 5:
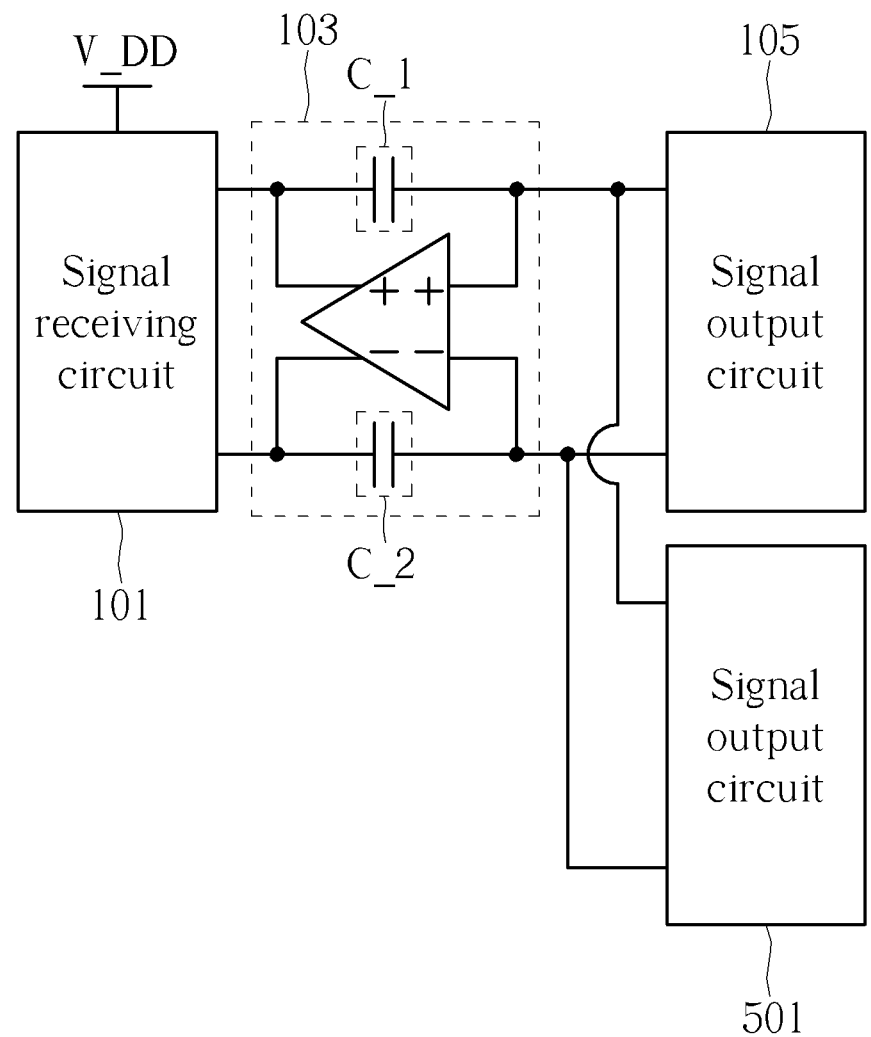
FIG. 5 and FIG. 6 are block diagrams illustrating receivers according to other embodiments of the present invention.
Figure 6:
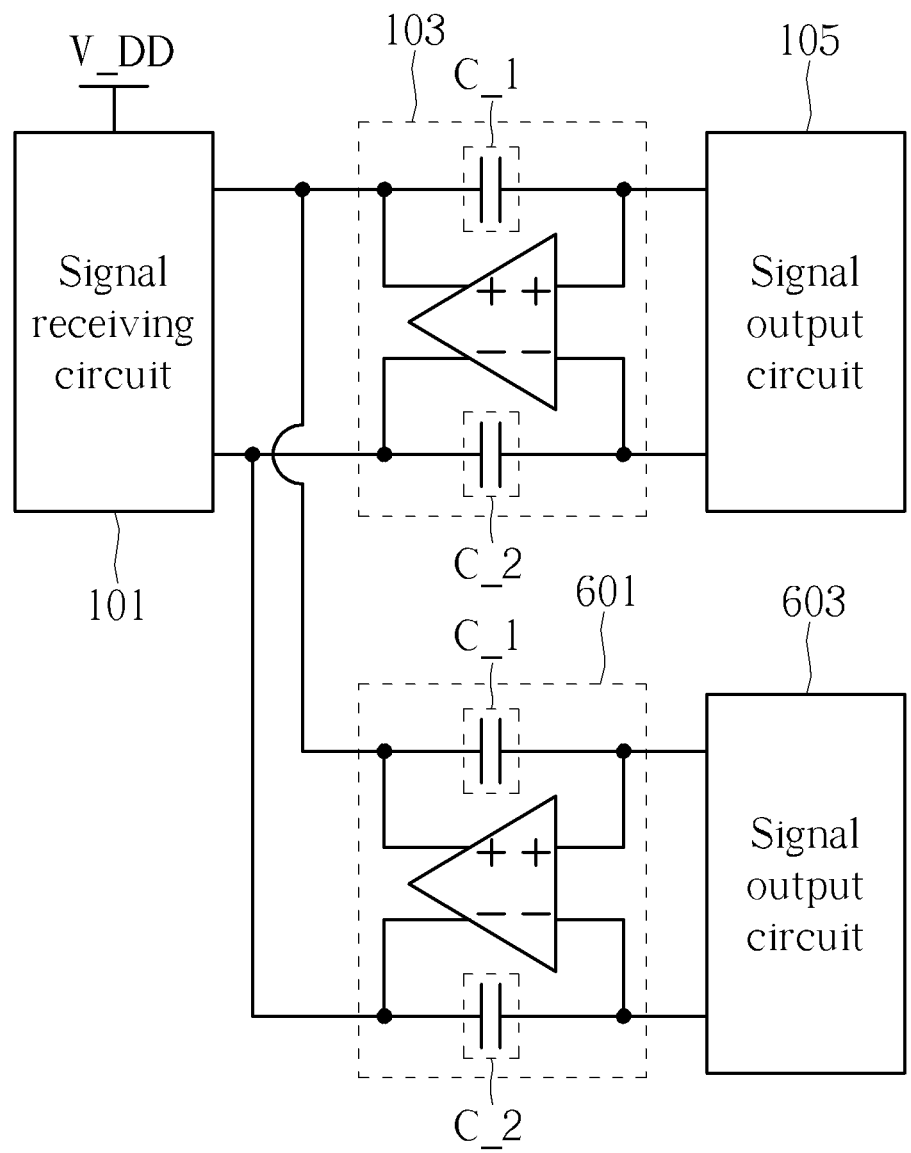

The above-mentioned embodiments can be applied to receivers having other circuit structures. FIG. 5 and FIG. 6 are block diagrams illustrating receivers according to other embodiments of the present invention. In the embodiment of FIG. 5, in addition to the signal receiving circuit 101, the negative impedance circuit 103, and the signal output circuit 105 shown in FIG. 1, another signal output circuit 501 may be further comprised. That is, a plurality of signal output circuits 105, 505 can share one signal receiving circuit 101 and one negative impedance circuit 103. In the embodiment of FIG. 6, in addition to the signal receiving circuit 101, the negative impedance circuit 103, and the signal output circuit 105 shown in FIG. 1, another negative impedance circuit 601 and another signal output circuit 603 may be further comprised. That is, a plurality of negative impedance circuits 103, 601 and the signal output circuits 105, 603 can share one signal receiving circuit 101. Such variations should also fall in the scope of the invention.

In view of above-mentioned embodiments, the negative impedance circuit provides signal gains and has a good linearity to improve the issue of the conventional negative impedance circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, comprising:
   a signal receiving circuit, coupled to a first predetermined voltage level, configured to generate a first input signal and a second input signal;
   a signal output circuit, configured to respectively generate a first output signal and a second output signal according to the first input signal and the second input signal;
   a negative impedance circuit, comprising a first input terminal, a second input terminal, a first output terminal and a second output terminal, wherein the first output terminal and the second output terminal are coupled to the signal receiving circuit, and the first input terminal, the second input terminal are coupled to the signal output circuit, wherein the negative impedance circuit receives the first input signal at the first input terminal and amplifies the first input signal to generate a first amplified input signal at the second output terminal, wherein the negative impedance circuit receives the second input signal at the second input terminal and amplifies the second input signal to generate a second amplified input signal at the first output terminal;
   a first capacitor, comprising a first terminal coupled to the first output terminal and comprising a second terminal coupled to the first input terminal;
   a second capacitor, comprising a first terminal coupled to the second output terminal and comprising a second terminal coupled to the second input terminal;
   wherein a first DC voltage level at the first terminal of the first capacitor is different from a second DC voltage level at the second terminal of the first capacitor, and a third DC voltage level at the first terminal of the second capacitor is different from a fourth DC voltage level at the second terminal of the second capacitor, thereby an impedance-signal variation rate is lower than a predetermined level.

2. The signal processing circuit of claim 1, wherein if the signal receiving circuit comprises at least one first type of transistor, then the first DC voltage level at the first terminal of the first capacitor is higher than the second DC level at the second terminal of the first capacitor, and a third DC voltage level at the first terminal of the second capacitor is higher than a fourth DC voltage level at the second terminal of the second capacitor.

3. The signal processing circuit of claim 1, wherein if the signal receiving circuit comprises at least one second type of transistor, then the first DC voltage level at the first terminal of the first capacitor is lower than the second DC level at the second terminal of the first capacitor, and a third DC voltage level at the first terminal of the second capacitor is lower than a fourth DC voltage level at the second terminal of the second capacitor.

4. The signal processing circuit of claim 1, wherein the negative impedance circuit comprises:
a first transistor, comprising a control terminal coupled to the second terminal of the first capacitor, a first terminal coupled to the first terminal of the second capacitor, and a second terminal coupled to a second predetermined voltage level;
a second transistor, comprising a control terminal coupled to the second terminal of the second capacitor, a first terminal coupled to the first terminal of the first capacitor, and a second terminal coupled to the second predetermined voltage level.

5. The signal processing circuit of claim 4,
wherein the first transistor is a first NMOS or a first PMOS;
wherein a gate of the first NMOS or the first PMOS is the control terminal of the first transistor, a drain of the first NMOS or the first PMOS is the first terminal of the first transistor, and a source of the first NMOS or the first PMOS is the second terminal of the first transistor;
wherein the second transistor is a second NMOS or a second PMOS;
wherein a gate of the second NMOS or the second PMOS is the control terminal of the second transistor, a drain of the second NMOS or the second PMOS is the first terminal of the second transistor, and a source of the second NMOS or the second PMOS is the second terminal of the second transistor.

6. The signal processing circuit of claim 1, wherein the signal output circuit comprises:
a mixer circuit, configured to down-convert frequencies of the first amplified input signal and the second amplified input signal to generate a first down-converted signal and a second down-converted signal; and
a current to voltage converter, coupled to the mixer circuit, configured to respectively generate the first output signal and the second output signal according to the first down-converted signal and the second down-converted signal, wherein the current to voltage converter comprises:
an operational amplifier, comprising a first input terminal, a second input terminal, a first output terminal and a second output terminal, wherein the first input terminal and the second input terminal are coupled to the mixer circuit to respectively output the first output signal and the second output signal, wherein the operational amplifier generates the second DC voltage at the first output terminal for the second terminal of the first capacitor and generates the fourth DC voltage at the second output terminal for the second terminal of the second capacitor.

7. The signal processing circuit of claim 6,
wherein the current to voltage converter further comprises a first current path and a second current path, wherein the first current path is coupled between the first input terminal of the operational amplifier and the first output terminal, and the second current path is coupled between the second input terminal of the operational amplifier and the second output terminal;
wherein the first current path comprises a first resistor and a third capacitor which are coupled between the first input terminal and the first output terminal, and the second current path comprises a second resistor and a fourth capacitor which are coupled between the second input terminal and the second output terminal.

8. The signal processing circuit of claim 6, wherein the current to voltage converter further comprises a current adjusting circuit configured to adjust a current of the operational amplifier to adjust the second DC voltage level and the fourth DC voltage level.

9. The signal processing circuit of claim 8, wherein current adjusting circuit comprises:
a comparator, comprising a first input terminal and a second terminal;
a third resistor, coupled between the first output terminal of the operational amplifier and the first input terminal of the comparator;
a fourth resistor, coupled between the second output terminal of the operational amplifier and the first input terminal of the comparator;
wherein the second input terminal of the comparator receives a third predetermined voltage level;
wherein the comparator outputs a control signal to control the current of the operational amplifier to adjust the second DC voltage level and the fourth voltage level to the third predetermined voltage level;
wherein the third predetermined voltage level is N times of the first predetermined voltage level, wherein N is a non-integer between 0 and 1.

10. The signal processing circuit of claim 1,
wherein the signal receiving circuit comprises a second inductor, a third inductor, a third transistor and a fourth transistor;
wherein the first inductor, the second inductor and the third transistor generate the second input signal to the negative impedance circuit according to a second initial input signal;
wherein the first inductor, the third inductor and the fourth transistor generate the first input signal to the negative impedance circuit according to a first initial input signal.

11. A receiver, comprising:
a signal receiving circuit, coupled to a first predetermined voltage level, configured to generate a first input signal and a second input signal;
a signal output circuit, configured to respectively generate a first output signal and a second output signal according to the first input signal and the second input signal;
a negative impedance circuit, comprising a first input terminal, a second input terminal, a first output terminal and a second output terminal, wherein the first output terminal and the second output terminal are coupled to the signal receiving circuit, and the first input terminal, the second input terminal are coupled to the signal output circuit, wherein the negative impedance circuit receives the first input signal at the first input terminal and amplifies the first input signal to generate a first amplified input signal at the second output terminal, wherein the negative impedance circuit receives the second input signal at the second input terminal and amplifies the second input signal to generate a second amplified input signal at the first output terminal;

a first capacitor, comprising a first terminal coupled to the first output terminal and comprising a second terminal coupled to the first input terminal;

a second capacitor, comprising a first terminal coupled to the second output terminal and comprising a second terminal coupled to the second input terminal;

wherein a first DC voltage level at the first terminal of the first capacitor is different from a second DC voltage level at the second terminal of the first capacitor, and a third DC voltage level at the first terminal of the second capacitor is different from a fourth DC voltage level at the second terminal of the second capacitor, thereby an impedance-signal variation rate is lower than a predetermined level.

12. The receiver of claim 11, wherein if the signal receiving circuit comprises at least one first type of transistor, then the first DC voltage level at the first terminal of the first capacitor is higher than the second DC level at the second terminal of the first capacitor, and a third DC voltage level at the first terminal of the second capacitor is higher than a fourth DC voltage level at the second terminal of the second capacitor.

13. The receiver of claim 11, wherein if the signal receiving circuit comprises at least one second type of transistor, then the first DC voltage level at the first terminal of the first capacitor is lower than the second DC level at the second terminal of the first capacitor, and a third DC voltage level at the first terminal of the second capacitor is lower than a fourth DC voltage level at the second terminal of the second capacitor.

14. The receiver of claim 11, wherein the negative impedance circuit comprises:

a first transistor, comprising a control terminal coupled to the second terminal of the first capacitor, a first terminal coupled to the first terminal of the second capacitor, and a second terminal coupled to a second predetermined voltage level;

a second transistor, comprising a control terminal coupled to the second terminal of the second capacitor, a first terminal coupled to the first terminal of the first capacitor, and a second terminal coupled to the second predetermined voltage level.

15. The receiver of claim 14, wherein the first transistor is a first NMOS or a first PMOS;

wherein a gate of the first NMOS or the first PMOS is the control terminal of the first transistor, a drain of the first NMOS or the first PMOS is the first terminal of the first transistor, and a source of the first NMOS or the first PMOS is the second terminal of the first transistor;

wherein the second transistor is a second NMOS or a second PMOS;

wherein a gate of the second NMOS or the second PMOS is the control terminal of the second transistor, a drain of the second NMOS or the second PMOS is the first terminal of the second transistor, and a source of the second NMOS or the second PMOS is the second terminal of the second transistor.

16. The receiver of claim 11, wherein the signal output circuit comprises:

a mixer circuit, configured to down-convert frequencies of the first amplified input signal and the second amplified input signal to generate a first down-converted signal and a second down-converted signal; and a current to voltage converter, coupled to the mixer circuit, configured to respectively generate the first output signal and the second output signal according to the first down-converted signal and the second down-converted signal, wherein the current to voltage converter comprises:

an operational amplifier, comprising a first input terminal, a second input terminal, a first output terminal and a second output terminal, wherein the first input terminal and the second input terminal are coupled to the mixer circuit to respectively output the first output signal and the second output signal, wherein the operational amplifier generates the second DC voltage at the first output terminal for the second terminal of the first capacitor and generates the fourth DC voltage at the second output terminal for the second terminal of the second capacitor.

17. The receiver of claim 16, wherein the current to voltage converter further comprises a first current path and a second current path, wherein the first current path is coupled between the first input terminal of the operational amplifier and the first output terminal, and the second current path is coupled between the second input terminal of the operational amplifier and the second output terminal;

wherein the first current path comprises a first resistor and a third capacitor which are coupled between the first input terminal and the first output terminal, and the second current path comprises a second resistor and a fourth capacitor which are coupled between the second input terminal and the second output terminal.

18. The receiver of claim 16, wherein the current to voltage converter further comprises a current adjusting circuit configured to adjust a current of the operational amplifier to adjust the second DC voltage level and the fourth DC voltage level.

19. The receiver of claim 18, wherein current adjusting circuit comprises:

a comparator, comprising a first input terminal and a second terminal;

a third resistor, coupled between the first output terminal of the operational amplifier and the first input terminal of the comparator;

a fourth resistor, coupled between the second output terminal of the operational amplifier and the first input terminal of the comparator;

wherein the second input terminal of the comparator receives a third predetermined voltage level;

wherein the comparator outputs a control signal to control the current of the operational amplifier to adjust the second DC voltage level and the fourth voltage level to the third predetermined voltage level;

wherein the third predetermined voltage level is N times of the first predetermined voltage level, wherein N is a non-integer between 0 and 1.

20. The receiver of claim 11, wherein the signal receiving circuit comprises a second inductor, a third inductor, a third transistor and a fourth transistor;

wherein the first inductor, the second inductor and the third transistor generate the second input signal to the negative impedance circuit according to a second initial input signal;

wherein the first inductor, the third inductor and the fourth transistor generate the first input signal to the negative impedance circuit according to a first initial input signal.

* * * * *